United States Patent [19]

Blenkhorn

[11] Patent Number: 4,840,757
[45] Date of Patent: Jun. 20, 1989

[54] REPLICATING PROCESS FOR INTERFERENCE PATTERNS

[75] Inventor: Gary P. Blenkhorn, Cape Elizabeth, Me.

[73] Assignee: S. D. Warren Company, Westbrook, Me.

[21] Appl. No.: 51,891

[22] Filed: May 19, 1987

[51] Int. Cl.4 .......................................... B29D 17/00
[52] U.S. Cl. ..................... 264/22; 156/209;
156/219; 156/232; 156/242; 156/275.5;
156/289; 156/307.1; 264/213; 264/214;
264/226
[58] Field of Search ............... 156/196, 199, 209, 219,
156/231, 232, 238, 242, 245–247, 272.2, 344,
273.3, 273.5, 275.5, 289, 307.1, 307.4, 307.7,
235; 264/213–214, 216, 22, 25, 226, 227, 283,
243; 427/44, 54.1, 35, 362

[56] References Cited

U.S. PATENT DOCUMENTS

| | | | |
|---|---|---|---|
| 2,867,263 | 1/1959 | Bartlett | 156/231 |
| 4,289,821 | 9/1981 | Gray | 156/247 |
| 4,427,732 | 1/1984 | Gray | 156/245 |
| 4,758,296 | 7/1988 | McGrew | 156/231 |

Primary Examiner—Merrell C. Cashion, Jr.
Attorney, Agent, or Firm—Francis M. DiBiase

[57] ABSTRACT

Disclosed is a continuous process for replicating interference patterns in radiation curable coating compositions or materials. Radiation curable coatings are brought into contact with interference patterns borne on the surface of an endless belt or revolving drum. The curable coating which may be supported by a substrate or unsupported is irradiated to cure it at least sufficiently so that it can be stripped from the replicating surface.

1 Claim, 1 Drawing Sheet

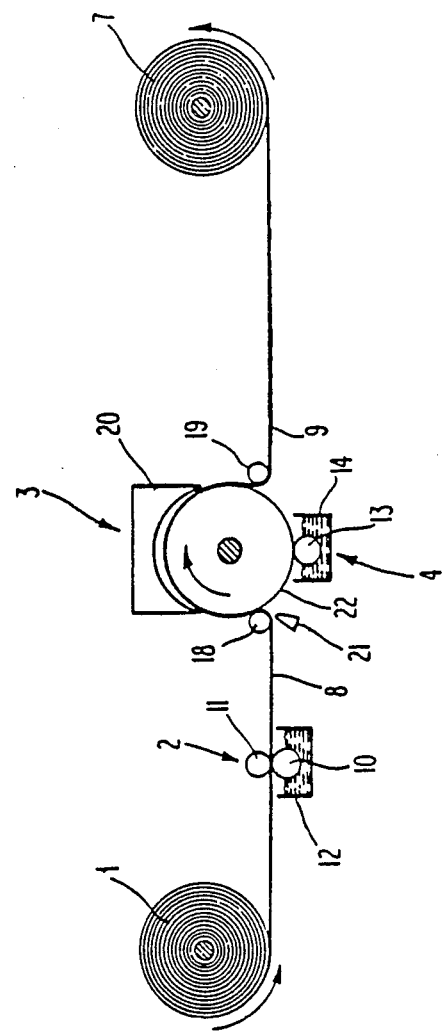

4,840,757

REPLICATING PROCESS FOR INTERFERENCE PATTERNS

TECHNICAL FIELD

The present invention relates to a process for replicating patterns in curable coatings. The patterns are characterized by the fact that the dimensions of the patterns are at or below the visible wave length of light. These patterns are generally referred to as interference patterns and typical of these patterns are those commonly known as holographic information patterns and diffraction gratings. In the process of the invention a radiation curable composition is coated on a substrate and pressed against the surface bearing the pattern to be reproduced. The curable coating is irradiated to at least cure the coating sufficiently so that it can be removed from the pattern surface and with the pattern replicated in the coating.

BACKGROUND ART

Probably the most popular type of patterns at or below the visible wave length of light are holograms. While other types exist such as diffraction gratings, it will be simpler to talk generally abut holograms since it is not the particular kind of this pattern of concern here nor the preparation of a particular pattern. Instead it is the process of replicating these patterns of this size from an original.

Holography is a fairly new technology. It was discovered about forty years ago and only in the past ten years have commercial applications appeared. Very simply described holography is the recording of a wave or wave front. It is a technical process for forming a visual record of an object wherein the image produced is three dimensional and appears as solid as the original object. There are several types of holograms but the main interest of the present invention is in the phase type embossed holograms of which one commonly known type is called a white light hologram.

An original holographic recording requires a certain amount of time to produce and thus the recording process does not lend itself readily to mass production. Consequently processes have been developed for converting original holographic recordings into master holograms from which replications can be made.

One known method of preparing a master phase embossed hologram involves the following steps:

1. Preparation of a hologram on photo resist emulsion film through an original interference pattern by laser exposure;
2. Developing the photo resist whereby the interference pattern is now a series of ultrafine ridges;
3. Electrodepositing metal on the interference pattern to build up a metal mold or master; and
4. Removing the master phase embossed hologram from the developed photo resist film.

The master can now be used to impress the interference pattern into plastic for large scale production of reflection holograms. This is commonly done by what is known as the hot stamp process. A thermoplastic deformable plastic film that has been first metallized is placed in contact with the pattern surface of the master hologram. The composite is pressed or stamped together while heat is used to soften the plastic so that it deforms sufficiently to the interference pattern. The two layers are then separated with the interference pattern in the plastic film. The metallic coating functions like a mirror and reflects white light waves through the interference pattern to create the changing images of the pattern.

Though the hot stamp process for replication is the process most commonly used, it suffers from several serious disadvantages. The first disadvantage relates to the materials involved. A requisite for the process is a deformable plastic film of the thermoplastic type. During the replicating process, the heat used must be carefully controlled. If not enough heat is used, the plastic film will not deform. If the heat is excessive, the image will be "flowed away." Even when replicating conditions are carefully controlled, the thermal stability of the resultant reproduction must be considered. This reproduction is still thermoplastic and can be again deformed if subjected to excessive heat. Non-thermoplastic materials which could provide many desirable properties to the finished product cannot be utilized in the hot stamping process.

Another disadvantage of the hot stamp process is that it is not a continuous operation. The hot stamp operation requires uniform heat and pressure in its operation as opposed to endless belts and casting drums.

In conventional hot stamp operations, a composite of the holographic master and the plastic film are placed in a press having at least one heated platen. The press is closed for a sufficient period of time to deform the plastic film. The press is opened and the composite is separated. The operation is limited to the size of the press. In turn, the size of the final hologram determines the number of hologram images that can be set in place on the hologram master. In contrast, endless belts and casting drums offer the opportunity for a continuous replication process. In using endless belts and drums, masters on the belts and drums are contacted with the plastic film that receive the image by means of a pressure roll which forms a nip with the belt or roll to join the two materials together.

Lastly, the hot stamp process is an embossing process that deforms the plastic coating. Usually an embossing process does not give 100% replication of patterns, especially the ultrafine patterns such as those with which the present invention is concerned.

U.S. Pat. Nos. 4,289,821 and 4,322,450 describe processes for the manufacture of release coated webs. In these process a web is coated with an electron beam curable coating which when cured has release properties. The freshly coated web is brought in contact with a continuous replicating surface and while in contact the web is irradiated on its back surface by an electron beam to cure the coating. Once the coating is cured it can be removed from the replicating surface and the pattern of the surface is replicated in the coating.

Representative of patterns made by the processes of these patents are leather and wood grain patterns as well as very uniform patterns which provide satin and low gloss finishes. Patterns such as these on the replicating surfaces and on the surfaces of replicated products are identifiable as peaks and valleys and they are measurable.

Using a Surtronic 3P profiling instrument, a set of 7 different patterns, representative of finer replications made by this process, was measured. The instrument was adapted with a data acquisition interface and related software to generate the average spacing between peaks and the average vertical distance between peaks and valleys. The instrument was adjusted to filter out any part of the patterns with a wave length of 250 microns or greater. For the set of samples, the peak to peak average was from 7.5 microns to 27.5 microns. The peak to valley average vertical distance was from 2.1 microns to 39.6 microns, far greater than the wave length of visible light.

DISCLOSURE OF THE INVENTION

It is an object of this invention to replicate with vitually 100% fidelity patterns of a size that are at or below the wave length of light. The patterns reproduced will exhibit the same light wave characteristics as the original. For example, if the original provides three dimensional holographic images, the reproduction will also. It is surprising that this degree of reproducibility could be obtained for such small patterns.

It is a feature of this invention to employ radiation curable coatings.

It is a further feature of this invention that the radiation curable coatings can be applied to substrates or can be cast as self-supporting films.

It is a further feature of this invention that the radiation cured coatings may have release properties and the patterns replicated therein can themselves be used for transferring the same pattern to films and decorative laminates by known casting and laminating processes. Other well known uses include heat transferring printed designs against receptive surfaces (e.g. T-shirts) and the manufacture of pressure sensitive adhesive webs for labels and decals.

It is an advantage of this invention to be able to carry out the replication in a continuous process.

According to one embodiment of the present invention, substrates, which are preferably sheet-like materials such as paper and plastic film, are coated on one side with a radiation curable coating. This coated surface while still conformable is then pressed against a replicating surface bearing a light wave interference pattern of a size that is at or below the visible wave length of light to cause the surface of the coating to conform to the interference pattern surface. The composite is irradiated at least sufficiently to set the curable resin and then removed from the replicating surface with the cured resin attached to the substrate. The substrate with the cured resin coating has a virtually 100% replication of the replicating pattern.

If no substrate is to be part of the final product, as is the case in another embodiment, the radiation curable coating may be applied to a temporary carrier or directly onto the replicating surface. After irradiation, the cured coating is a self-supporting, patterned film and is separated from the temporary carrier. Any number of radiation curable coating compositions may be used. Especially suitable are compositions such as those described in U.S. Pat. Nos. 4,327,121 and 4,311,766. The from of radiaton employed is preferably electron beam or ultraviolet light.

The replicating surface is preferably provided by a continuous surface such as an endless belt, roll, drum, or other cylindrical surface, which can be revolved past a radiation curing device. The coating is preferably applied directly to the substrate, before it engages the continuous surface, but can also be applied directly to the replicating surface.

The replicating surface is preferably a metal roll with the pattern directly replicated on its surface but can take other forms such as a plate or sleeve attached to the roll surface.

The invention is also the products produced by the above processes.

BRIEF DESCRIPTION OF THE DRAWING

The FIGURE illustrates schematically the preferred apparatus for carrying out the present invention. The FIGURE shows both a substrate and a replicating roll being coated with an electron beam curable composition, after which the substrate, coating and roll are revolved together past an electron beam curing station where the coating is cured, and then the substrate with the cured coating adhered to it, is stripped from the roll. In practice, coating is preferably applied either to the substrate or to the replicating roll, but not both.

BEST MOST FOR CARRYING OUT THE INVENTION

Referring to the FIGURE a roll 1 of plastic film is unwound and passed through the following: a coating station 2, and an electron beam curing station 3, from where it is wound onto roll 7. The FIGURE also shows alternative coating station 4. The coating station 2 is provided by coating roll 10 and backup roll 11 positioned to form a nip through which the film 8 passes. Coating roll 10 rotates through reservoir 12 of the coating material and transfers a predetermined layer of coating material to one side of film 8.

Alternative coating station 4 is provided by coating roll 13 mounted for rotation in reservoir 14 of coating material and against replicating roll 22. The coating roll 13 transfers a predetermined layer of coating material to the replicating roll 22. The coating station 4 would be used when it is desirable to make a self supporting cured film from the radiation curable coating. In such an event, coating material would be applied directly to replicating roll 22. The film 8 would preferably be replaced by a temporary carrier which would support the coating through the curing operation and could be readily stripped from the cured film at a convenient location.

The above-described coating apparatus is preferred, but any of the conventional coating apparatus, such as knife-over-roll, offset gravure, reverse roll, etc. can be used.

The replicative surface is provided by roll 22, in which the desired pattern is electroformed on the surface. The film 8 is pressed against the roll 22 by press roll 18 to assure that the coating fills the depressions in the electroformed surface of the roll 22 and that there is continuous intimate contact with the film. The roll 22 is mounted for rotation by conventional drive means (not shown) and continuously carries the film and coating past the electron beam radiation unit 20 which irradiates the coating and cures it at least sufficiently to permit it to be removed from the roll 22 at take-off roll 19, securely attached to the film 9, and to assure permanent replication of the desired surface.

Electron beam radiation units useful in the present invention are readily available and typically consist of a transformer capable of stepping up line voltage and an electron accelerator. In one type of machine the electrons are generated from a point source filament and then scanned electromagnetically like a television set to traverse the coated object. In another type of machine, the electrons are generated in a curtain from an extended filament which can irradiate the entire width of the surface without the need for scanning. While commercial machines are available with accelerating voltages of over a million electron volts, the range for this and similar coating applications is typically from 150–300 KV (kiloelectron volts). It is common when curing coatings with electron beam radiation units to take steps to eliminate oxygen from the surface of the coating. In the present apparatus, a nitrogen atmosphere is preferably applied through nozzle 21.

Typical resins useful in electron beam curable coatings are styrented polyesters and acrylics, such as vinyl copolymers of various monomers and glycidyl methacrylate reacted with acrylic acid, isocyanate prepolymers reacted with an hydroxyalkyl acrylate, epoxy resins reacted with acrylic or methacrylic acid, and hydroxyalkyl acrylate reacted with an anhydride and subsequently reacted with an epoxy.

Coating compositions which can be cured by electron beam radiation and are suitable for release functions generally include some or all of the following:

(a) a moderate molecular weight functional oligomer;

(b) a reactive monomer diluent (a mono or polyfunctional acrylate or methacrylate) such as trimethylolpropane triacylate or isodecyl acrylate;

(c) pigments or fillers such as clay, silica or diatomaceous earth;

(d) reactive or non-reactive silicones; and (e) metallic particles.

Although the preferable form for carrying out the radiation curing in the invention is by electron beam, there are instances when UV radiation can also be employed with satisfactory results. In such instances a substrate would be selected that would be transparent to UV radiation. The following examples illustrate embodiments of the invention.

EXAMPLE 1

Replicating Holographic Patterns on Plastic Film in a Continuous Process

A holographic master of the type that is conventionally used for hot stamp replicating was adhesively attached to the surface of a revolving drum such as that shown in the FIGURE. In an arrangement similar to that shown in the FIGURE, a polyester film of 4 mil thickness and pretreated for adhesion was coated with a radiation curable coating having the following composition:

Novacure 1701 Oligomer an acrylated acrylic resin (manufactured by Interez Inc.): 7 parts, by Weight
Isodecyl Acrylate: 5 parts, by Weight
Trimethylolpropane Triacrylate: 8 parts, by Weight An organo functional silicone fluid was added to the coating in an amount of 2% based on the total coating weight for improving release of a plastic film or sheet later formed against the product produced in this example.

Following this the coated film was pressed against the revolving drum and exposed to electron beam radiation at 4 megarads dosage. The speed of the operation was 150 fpm. After curing, the film was examined for pattern replication. The pattern master was replicated faithfully on the film numerous times at repetitive intervals equal to the circumference of the revolving drum.

As evidence of faithful reproduction, samples of the holographic master die and the patterned and cured polyester film were prepared for viewing topographically and in cross-section by a scanning electron microscope. The samples were viewed at 10,000× magnification and photographed. The peaks and valleys of the patterns were very identifiable in the photographs. In an average of measurements for both samples, the distance from peak to peak was measured at less than 1 micron (about 0.75 micron). The vertical distance from peak to valley on the average for both samples was also less than 1 micron (about 0.5 micron) and less than that for peak to peak. The visible wave length of light is from 4,000 angstroms to 7,000 angstroms. One micron is equal to 10,000 angstroms. These patterns were at and below 7.000 angstroms. It is worth noting here that the resolving power of the profiling instrument mentioned earlier to measure prior art samples, is not great enough to measure the samples of the present invention.

As further evidence of faithful replication, the holographic image seen in the replicated film pattern showed the same three dimensional characteristics as the holographic image shown in the holographic master.

EXAMPLE 2

Replicating Holographic Patterns on Paper in a Continuous Process

This example is similar in all respects to Example 1 except that a paper web that had been conventionally starch sized and coated with pigment and binder was used in place of polyester film.

Results with the paper web were equally as good as those with the polyester film.

EXAMPLE 3

Preparation of Cast Vinyl Films with Holographic Patterns

It is known from U.S. Pat. Nos. 4,311,766 and 4,327,121 that certain electron beam radiation curable coatings have release properties and can have plastic films or sheets formed against them with the pattern in the radiation cured coating replicated in the plastic film or sheet. Examples are casting of plastic films and heat and pressure consolidation of plastic laminates. The addition of the organo functional silicane fluid to the radiation curable coatings used in Examples 1 and 2 can enhance such release properties. In this example, the cured and patterned polyester film of Example 1 and the cured and patterned paper web of Example 2 had vinyl films cast upon them and the vinyl films then bore another generation of the holographic pattern.

A polyvinyl chloride plastisol was cast on both the patterned polyester film product of Example 1 and the patterned paper product of Example 2. A Gardner metering knife was used to set down a wet film of 8 mils thickness. The plastisol was dried for 3 minutes at 100° C. and cured for 2 minutes at 190° C. The cast polyvinyl chloride film readily stripped from both the paper sample and the polyester film sample as a self-supporting film. The holographic pattern was faithfully replicated in the polyvinyl chloride film cast from the paper sample and the polyester film sample.

EXAMPLE 4

Preparation of Decorative Laminates with Holographic Patterns

In this example the patterned and cured products of Examples 1 and 2 were used as the release sheets to press decorative laminates. A 12 by 12 inch platen press at 280° F. and 1200 psi was used for pressing for 10 minutes. The configuration of the stack of materials in the press was from top to bottom:

1. Hot platen.

2. Patterned and cured products of Examples 1 and 2 (in separate pressing operations) with the patterned and cured surfaces facing down.

3. Melamine-formaldehyde pre-preg sheet
4. 3-phenolic sheets
5. Conventional release sheet, face up
6. ⅛ inch thick aluminum caul plate
7. Hot platen After pressing, the consolidated laminates were stripped from the patterned and cured products of Examples 1 and 2 being tested. Both the laminate pressed from the patterned and cured paper web product and the laminate pressed from the patterned and cured polyester film product had faithful replications of the holographic image on their surfaces.

One product of the invention is a release sheet suitable for heat transferring printed designs to receptive surfaces such as T-shirts and other articles of clothing. The release sheet comprises a substrate having on at least one side thereof a coating of a radiation curable composition which has been cured by radiation. The outer surface of the coating has a light wave interference pattern at or below the visible wave length of light formed by curing the coating while in contact with a replicating surface having the interference pattern. Using conventional heat transfer materials and processes, heat transferred printed designs can be prepared that have the same pattern in them as the release sheet.

Another product of the invention is a pressure sensitive adhesive coated web that is a sheet material with an adhesive coat and a release liner sheet. The sheet material comprises a substrate having on at least one side thereof a coating of a radiation curable composition which has been cured by radiation. The outer surface of the coating has a light wave interference pattern at or below the visible wave length of light formed by curing the coating while in contact with a replicating surface having the interference pattern. The sheet material has the same pattern in it as the replicating surface and the pressure sensitive adhesive web can be converted by known means to produce items such as labels, tapes and decals.

Having described the preferred embodiments of the invention, the scope of the invention is now set forth in the appended claims. Variation to preferred embodiments within the scope of the invention will be obvious to those skilled in the art.

What is claimed is:

1. In a method of forming a plastic film or sheet on or against a release sheet with a pattern, setting the film or sheet, and stripping the set film or sheet from the release sheet to leave the pattern replicated in the film or sheet, the improvement wherein the release sheet comprises a substrate having on at least one side thereof a coating of a radiation curable composition or material which has been cured by radiation, the outer surface of the coating having a light wave infernce pattern having a peak to valley definition of or less than 7,000 angstroms formed by curing the coating in intimate contact with a replicating surface having the interference pattern.

* * * * *